United States Patent [19]
Danek et al.

[11] Patent Number: 5,942,799
[45] Date of Patent: Aug. 24, 1999

[54] MULTILAYER DIFFUSION BARRIERS

[75] Inventors: Michal Danek, Sunnyvale; Karl B. Levy, Los Altos, both of Calif.

[73] Assignee: Novellus Systems, Inc., San Jose, Calif.

[21] Appl. No.: 08/974,451

[22] Filed: Nov. 20, 1997

[51] Int. Cl.[6] .......................... H01L 23/48; H01L 23/52; H01L 29/40
[52] U.S. Cl. .......................... 257/751; 257/758; 257/762; 257/753
[58] Field of Search .................................... 257/751, 758, 257/762, 753, 750

[56] References Cited

U.S. PATENT DOCUMENTS

| 5,416,359 | 5/1995 | Oda | 257/750 |
|---|---|---|---|
| 5,641,992 | 6/1997 | Lee et al. | 257/762 |

FOREIGN PATENT DOCUMENTS

| 4-27163 | 1/1992 | Japan | 257/751 |
|---|---|---|---|
| 086001640 | 3/1986 | WIPO | 257/751 |

OTHER PUBLICATIONS

K. K. Shih et al., "Ti/Ti–N Hf/Hf–N and W/W–N multilayer films with high mechanical hardness," Appl. Phys. Lett. 61(6), Aug. 10, 1992, pp. 654–656.

Chang Woo Lee et al., "Stress relaxation in plasma deposited tungsten nitride//tungsten bilayer," Appl. Phys. Lett. 65(8), Aug. 22, 1994, pp. 965–967.

Hideaki Ono et al., "Diffusion Barrier Effects Against Cu of W–N Layer Formed by Electron Cyclotron Resonance Plasma Nitridation on W Layer," Jpn. J. Appl. Phys., vol. 34., (1995, pp. 1827–1830.

J. P. Lu et al., "A New Method for Processing TiN–based Barrier Films through Thermal Decomposition of TDMAT Combined with Post–deposition Silane Anneal," Advanced Metallization and Interconnect Systems for ULSI Applications; Oct. 1996, Boston; Proceedings, pp. 45–48.

*Primary Examiner*—Valencia Martin-Wallace
*Assistant Examiner*—Jhihan B Clark
*Attorney, Agent, or Firm*—Skjerven, Morrill, MacPherson, Franklin & Friel LLP; David E. Steuber

[57] ABSTRACT

Multilayer diffusion barriers are used in integrated circuits. These diffusion barriers provide high electrical conductivity to carry current efficiently with fast response time, and additionally suppress diffusion between interconnect conductors, e.g. Cu, and the semiconductor device. Moreover, the present multilayer diffusion barriers adhere well to the underlying materials as well as to Cu.

In a preferred embodiment, the diffusion barriers comprise bilayers, each containing a first sublayer formed of a refractory metal, or a refractory metal nitride; and a second sublayer formed of a refractory metal nitride, a refractory metal silicon nitride, a refractory metal silicon boride, or a refractory metal oxonitride.

Multilayer diffusion barriers are deposited easily by CVD in a multistation module. The present structures can be applied to sub-0.25 μm logic, memory and application specific circuits with Cu as the primary conductor.

19 Claims, 2 Drawing Sheets

MULTILAYER DIFFUSION BARRIERS

FIELD OF THE INVENTION

The present invention relates to semiconductor devices and more particularly to the fabrication of silicon based integrated circuits having diffusion barriers between silicon contact regions and electrical interconnects.

BACKGROUND

Copper (Cu) is widely recognized as attractive to replace aluminum (Al) for interconnect conductors in next generation integrated circuits (IC's). Because of its lower resistivity, narrower copper conductors allow faster, higher density IC's than do aluminum conductors. Moreover, lower resistivity means lower energy consumption and heat dissipation. Copper shows much better electromigration resistance. This property provides for reduction of device operating voltage and better reliability. A problem with Cu interconnects, however, is that Cu diffuses into silicon (Si) at the contact regions as well as into intermetal dielectrics, causing device leakage and failure in manufacturing or operation.

Successful implementation of Cu as the primary conductor in the next generations of integrated circuits requires encapsulation of the Cu interconnection into diffusion barriers to block Cu migration. These barriers must possess superior metallurgical stability and electrical reliability, since barrier failure during device manufacture or actual operation would result in device leakage or breakdown. Conventional diffusion barrier materials include polycrystalline materials, such as titanium nitride (TiN), titanium tungsten (TiW), tantalum (Ta), and tantalum nitride (TaN). Diffusion of Cu along barrier grain boundaries has been identified as the primary failure mechanism with these materials.

Besides metallurgical and electrical reliability, Cu diffusion barriers have to meet other requirements, among them low electrical resistivity (typically <500 $\mu$ohm cm), good adhesion to dielectrics and metals, and chemical-mechanical polishing (CMP) compatibility. Good adhesion and CMP compatibility are difficult criteria to achieve with conventional barrier materials.

A variety of amorphous materials have been proposed as Cu diffusion barriers. For example, binary nitrides, e.g. TaN, TiN, $WN_x$ (tungsten nitride) and ternary silicon nitrides, e.g. $TiSi_xN_y$ (titanium silicon nitride), $WN_xSi_y$ (tungsten silicon nitride), and $TaSi_xN_y$ (tantalum silicon nitride) have been identified as excellent Cu diffusion barrier materials. However, application of these materials is limited because of poor adhesion, high resistivity, and unknown chemical-mechanical polishing (CMP) characteristics.

Even the implementation of conventional Al contact plugs requires a diffusion barrier to prevent Al permeation into the device junction during high temperature Al fill (450° C. to 500° C.). Conventional TiN barriers have to be saturated with oxygen to prevent Al permeation. However, oxidation of the TiN surface makes the Al fill difficult due to a poor surface wetability.

A number of investigators have described the performance of refractory metals, nitrides, and related ternary compounds as copper and aluminum barriers for integrated circuit applications. Improvement of Cu diffusion barrier performance of W by surface nitridation has been described by Ono et al. (Jpn. J. Appl. Phys. 34, 1827 (1995)). Stress relaxation in a WNx/W bilayer has been described by Lee and Kim (Appl. Phys. Lett. 65, 965 (1994)). Silane treatment of metallorganic chemical vapor deposition (MOCVD) TiN films has been described by J. P. Lu et al. (Advanced Metallization and Interconnect Systems For VLSI Applications; October 1996, Boston; Proceedings pg. 45). In a different field of technology, multilayer metal/metal nitride films as wear-resistant coatings for cutting tools have been described by Shih and Dove (Appl. Phys. Lett. 61, 654 (1992)).

Needed in the art are diffusion barriers for applications in integrated circuits, specifically in sub-0.25 $\mu$m logic, memory and application specific circuits with Cu as the primary interconnect conductor. These diffusion barriers must combine high overall electrical conductivity with reliable prevention of migration of Cu from interconnects into the semiconductor device. Additionally, the diffusion barriers must adhere well to the underlying materials as well as to Cu, and must exhibit mechanical integrity for chemical-mechanical polishing (CMP) compatibility.

SUMMARY OF THE INVENTION

In accordance with the invention, multilayer diffusion barriers are used in integrated circuits. These diffusion barriers have high electrical conductivity to carry current efficiently with fast response time, and additionally suppress the migration of atoms from interconnect conductors, e.g. Cu, to the intermetal dielectrics and to the semiconductor device contact region. Specifically, the present structures can be applied in sub-0.25 $\mu$m logic, memory and application specific circuits with Cu as the primary conductor. In these applications highly reliable, ultrathin (<100 angstroms), highly conformal, and minimally resistive (<500 $\mu$ohm cm) diffusion barriers are obtained. Additionally, the present diffusion barriers adhere well to the underlying materials as well as to Cu.

In a preferred embodiment, the diffusion barriers comprise alternating bilayers, where one sublayer (A) is formed of a refractory metal, or a refractory metal nitride; and the other sublayer (B) is a refractory metal nitride, a refractory metal silicon nitride, a refractory metal silicon boride, or a refractory metal oxonitride.

Material choices for the multilayer barriers are limited only by the thermodynamic and kinetic stability of the interfaces, and by manufacturability.

In operation, an electric current passes between an overlying interconnect conductor and an underlying semiconductor device region through a multilayer diffusion barrier stack in a direction substantially normal to the planes of the sublayers. Because of the structural and material properties of the sublayers, the multilayer diffusion barrier effectively suppresses the diffusion of atoms between the overlying interconnect conductor and underlying semiconductor device region but presents a low resistance to electric current between the overlying interconnect conductor and underlying semiconductor device region.

In accordance with the invention, the key diffusion barrier properties, such as overall electrical resistance, metallurgical stability, adhesion to the substrate, adhesion of subsequent films, overall mechanical integrity, chemical stability, and chemical-mechanical polishing characteristics, can be advantageously engineered by selecting the compositions and thicknesses of the barrier sublayers.

Multilayer diffusion barriers differentiate from conventional diffusion barriers in that grain boundary diffusion is suppressed by the multilayer film structure. The extent of the grain boundaries is limited to the thickness of the sublayers.

This results in superior diffusion barrier reliability in comparison with conventional diffusion barriers having a polycrystalline columnar texture.

Additionally, sheet resistance of multilayer diffusion barriers is substantially reduced from sheet resistance of conventional diffusion barriers. Layering a highly conductive material (sublayer A) with an ultrathin barrier material (sublayer B) yields low resistance multilayer diffusion barriers.

Additionally, adhesion to underlying substrate and subsequent metallization layers is enhanced relative to the adhesion of conventional diffusion barriers. The adhesion properties of a multilayer stack can be advantageously engineered by selecting the composition of the initial and final sublayers. The first sublayer is chosen to provide strong adhesion to the substrate, while the last sublayer is chosen to provide strong adhesion to the subsequently deposited conductive metal. This strong adhesion provides superior mechanical interface integrity, important to successful processing of wafers by chemical mechanical polishing (CMP).

Moreover, wetability of the surface of a multilayer diffusion barrier for a subsequent metal fill can be optimized by selecting the composition and properties of the final sublayer. Good wetability is critical for reliable metal fill (by PVD or CVD) of small size/high aspect ratio interconnect lines and vias.

Multilayer diffusion barriers may be deposited easily by a CVD process in a conventional multistation module.

Potential applications of the invention include diffusion barriers for copper interconnects, aluminum contact plugs, DRAM top plate electrodes, and gate poly-Si/W stacks.

DETAILED DESCRIPTION OF THE EMBODIMENTS

The present invention relates to semiconductor devices and more particularly to the fabrication of silicon based integrated circuits having diffusion barriers between silicon contact regions and electrical interconnects.

Figure 1:
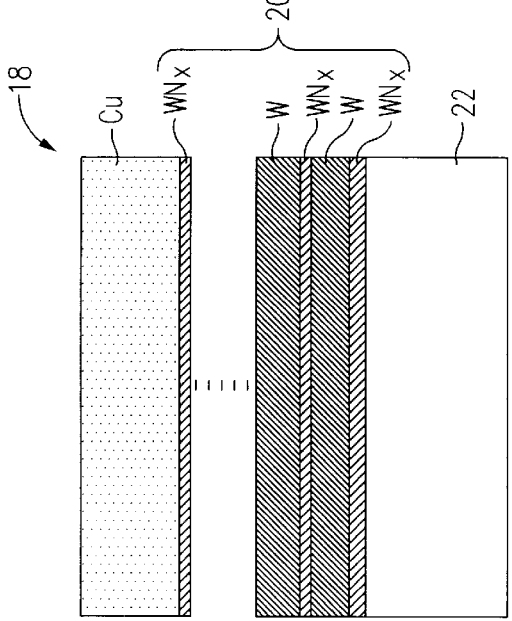
FIG. 1 is a schematic cross-sectional view of a generalized multilayer diffusion barrier, in accordance with the present invention.

FIG. 1 is a schematic cross-sectional view of a generalized multilayer diffusion barrier 10, in accordance with the present invention. In a preferred embodiment, multilayer diffusion barrier 10 comprises a stack 12 containing two materials, namely A and B, in alternating sublayers B1, A1, B2, A2, . . . Bn, An. Stack 12 separates a metal overlayer 14, e.g. interconnect conductor, from an underlayer 16, e.g. a semiconductor device, comprising silicon, dielectric, or metal.

Since stack 12 carries current, it must in general be highly conductive, dictating a structure comprising a minimum number of thin sublayers An, Bn having high individual conductivities. However, since stack 12 must also prevent the migration of atoms from conductive overlayer 14 into underlayer 16, it must contain a sufficient number of diffusion barrier sublayers An, Bn with grain boundary characteristics that inhibit such migration.

In operation, an electric current passes between overlayer 14 and underlayer 16 through stack 12 in a direction substantially normal to the planes of sublayers An, Bn. Because of the structure and the material properties of sublayers An, Bn, multilayer diffusion barrier 10 effectively blocks diffusion of atoms between overlayer 14 and underlayer 16 but presents a low resistance to electric current between overlayer 14 and underlayer 16.

Figure 2:
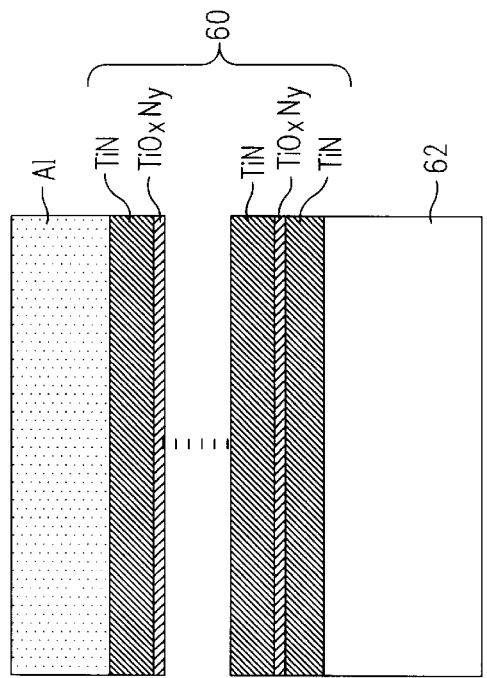
FIG. 2 is a schematic cross-sectional view of a multilayer diffusion barrier comprising a W/WN$_x$ stack, in accordance with an embodiment of the invention.

FIG. 2 is a schematic cross-sectional view of a multilayer diffusion barrier 18, in accordance with an embodiment of the invention. As shown in FIG. 2, multilayer diffusion barrier 18 comprises a stack 20 in which illustratively one sublayer material is tungsten (W) and the alternating sublayer material is tungsten nitride (WN$_x$). Stack 20 is shown as a barrier between a Cu overlayer and an underlayer 22, which can have a surface comprising either silicon (Si), silicon oxide (SiO$_2$) or metal (e.g., Cu, Al or W).

Referring to FIG. 1, multilayer diffusion barrier 10 may comprise alternating sublayers having a first sublayer (A) consisting of a material from any of the following groups: refractory metal (e.g., W, Ti, Ta, Mo, etc.) or refractory metal nitride (e.g., WN$_x$, TiN, TaN, etc.); and having a second sublayer (B) consisting of a material from any of the following groups: refractory metal nitride (e.g., WN$_x$, TiN, TaN, etc.), refractory metal silicon nitride (e.g., TiSi$_x$N$_y$, TaSi$_x$N$_y$, WSi$_x$N$_y$, etc.), refractory metal silicon boride (e.g., WSi$_x$B$_y$, etc.), or refractory metal oxonitride (e.g., TiO$_x$N$_y$, etc.); provided that sublayer material (A) and sublayer material (B) are mutually distinct materials.

Generally, material choices for multilayer diffusion barriers 10 are limited only by the thermodynamic and kinetic stability of the interfaces between sublayers An, Bn and between top and bottom sublayers and overlayer 14 and underlayer 16 materials, respectively, and by manufacturability.

The thermodynamic stability requirement means that chemical reaction between sublayer materials A and B is not thermodynamically favorable during sublayer formation or any subsequent processing step. However, even if the above interfaces are not thermodynamically stable, a chemical reaction may not occur if the kinetics are too slow. Illustratively, the Ti/TaN interface is thermodynamically unstable at room temperature (Ti+2TaN→TiN+Ta$_2$N with Δh°=−25.6 kcal/mol); however, the reaction is too slow at room temperature to be observed.

Referring to FIG. 2, the preferred thicknesses of the W and WN$_x$ sublayers are in a range from 30 angstroms to 50 angstroms and from 10 angstroms to 20 angstroms, respectively. The number of the sublayers may typically range from 3 to 10, preferably 5. In stack 20, a first WN$_x$ sublayer provides for adhesion of stack 20 to underlayer 22 and for nucleation of a first W sublayer. WN$_x$ sublayers are the actual diffusion barriers for Cu. W sublayers reduce the overall electrical resistance of stack 20 due to the lower resistivity of tungsten (approx. 10 μohm cm) relative to $WN_x$. Since the mechanical stress in $WN_x$ films is typically compressive, whereas the stress in W is tensile, alternation of W-$WN_x$ bilayers provides mechanical stress compensation in the final stack 20.

In operation an electric current passes between Cu overlayer and underlayer 22 through stack 20 in a direction substantially normal to the planes of sublayers W, $WN_x$. Because of the structure and the material properties of sublayers W, $WN_x$, multilayer diffusion barrier 18 effectively blocks diffusion of atoms between Cu overlayer and underlayer 22 but presents a low resistance to electric current between Cu overlayer and underlayer 22.

Figure 3:
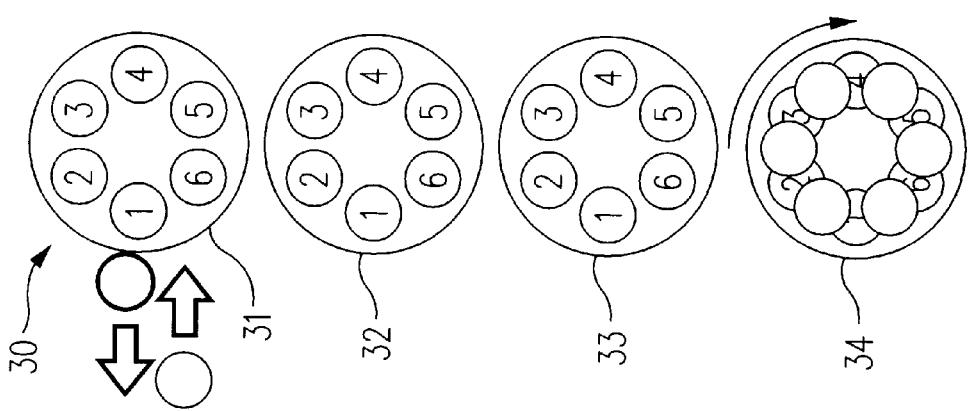
FIG. 3 is a schematic diagram of a deposition system for forming the W/WN$_x$ stack of FIG. 2.

FIG. 3 is a schematic diagram of a deposition system 30 for forming W/$WN_x$ stack 20. W/$WN_x$ stack 20 is deposited by a sequential process combining plasma enhanced chemical vapor deposited (PECVD) $WN_x$, conventional chemical vapor deposited (CVD) W, and post-deposition plasma nitridation of W sublayers to form $WN_x$. The deposition is conducted in a conventional system 30 (e.g., Novellus C1 or Altus system), with six deposition stations (denoted individually by circled numerals 1, 2, . . . ,6). Each station comprises a conventional resistively heated pedestal and RF powered showerhead. Station 1 is used for loading and unloading wafers. In a first processing step 31, a deposited wafer is unloaded from station 1 and a new wafer is loaded (indicated by arrows in first processing step 31). The other stations are idle. In a second processing step 32, a wafer in station 1 is heated to the process temperature (typically 400° C.), while the wafers in the other stations 2–6 are deposited with CVD W. In a third processing step 33, the wafer in station 1 is deposited with a $WN_x$ adhesion layer using PECVD. The preferred precursors are $WF_6$, $N_2$ and $H_2$. In third processing step 33, the W depositions on the wafers in the other stations 2–6 are nitridized using $N_2$ and $H_2$ plasma. In a fourth processing step 34, all wafers are rotated to a next station, and the entire processing sequence of steps 31–34 is repeated. Other deposition chemistries can be applied using the described processing sequence (e.g., $WF_6$, $NH_3$, and $H_2$).

Figure 4:
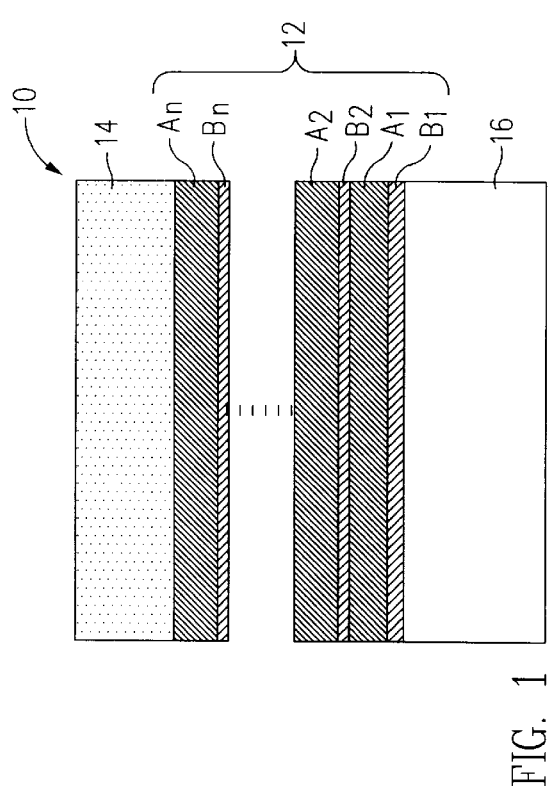
FIG. 4 is a schematic cross-sectional view of a multilayer diffusion barrier comprising a TiN/TiSi$_x$N$_y$ stack, in accordance with a further embodiment of the invention.

FIG. 4 is a schematic cross-sectional view of a multilayer diffusion barrier, in accordance with a further embodiment of the invention. As shown in FIG. 4, titanium nitride (TiN) sublayers are alternated with titanium silicon nitride ($TiSi_xN_y$) sublayers. A TiN/$TiSi_xN_y$ stack 40 is shown as a diffusion barrier between Cu and an underlayer 42, which can be Si, $SiO_2$ or metal (e.g., Cu, Al or W). The preferred thickness of the TiN and $TiSi_xN_y$ layers is in a range of from 30 angstroms to 50 angstroms and from 10 angstroms to 20 angstroms, respectively. The number of sublayers typically ranges from 3 to 10, preferably 5. In stack 40, the first and the last TiN films are adhesion layers. The $TiSi_xN_y$ sublayers are the actual diffusion barriers for Cu.

In operation an electric current passes between Cu overlayer and underlayer 42 through stack 40 in a direction substantially normal to the planes of sublayers TiN, $TiSi_xN_y$. Because of the structure and the material properties of sublayers TiN, $TiSi_xN_y$, stack 40 effectively blocks diffusion of atoms between Cu overlayer and underlayer 42 but presents a low resistance to electric current between Cu overlayer and underlayer 42.

Figure 5:
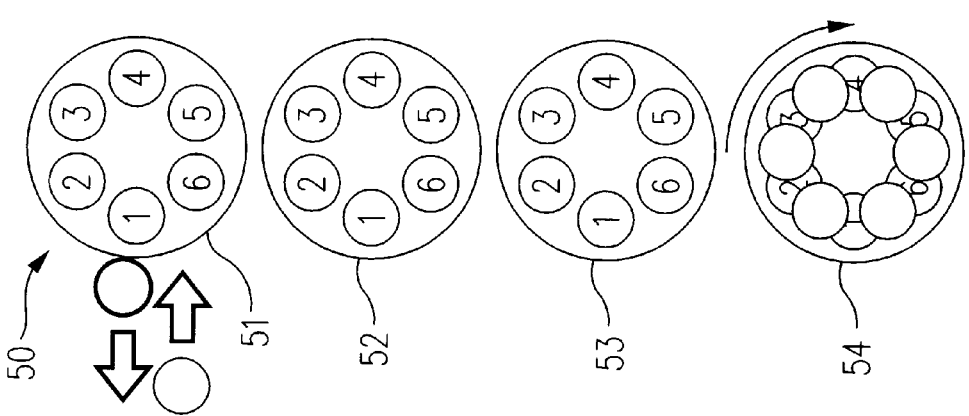
FIG. 5 is a schematic diagram of a deposition system for forming the TiN/TiSi$_x$N$_y$ stack of FIG. 4.

FIG. 5 is a schematic diagram of a deposition system 50 for forming TiN/$TiSi_xN_y$ stack 40. TiN/$TiSi_xN_y$ stack 40 is deposited by a sequential process combining metallorganic chemical vapor deposition (MOCVD) of TiN and post-deposition treatment of the film surface in silane (FIG. 5). The deposition is conducted on system 50 having six deposition stations, denoted by circled numerals 1, 2, . . . ,6. Each station consists of a resistively heated pedestal and showerhead. In a first processing step 51, a processed wafer is unloaded from station 1 and a new wafer is loaded, while the other stations are idle. In a second processing step 52, the wafer in station 1 is heated to the processing temperature (typically 300° C.), while the other wafers are deposited with MOCVD TiN using tetrakis (diethylamido)titanium (TDEAT) and ammonia. In a third processing step 53, the wafers in stations 2–5 are soaked in silane while the wafers in stations 1 and 6 are idle. In a fourth processing step 54, all wafers are rotated to their respective next stations, and the entire processing sequence of steps 51–54 is repeated. Other silicon bearing precursors, such as disilane and trisilane, may be used for the silicidation processing step 53.

Figure 6:
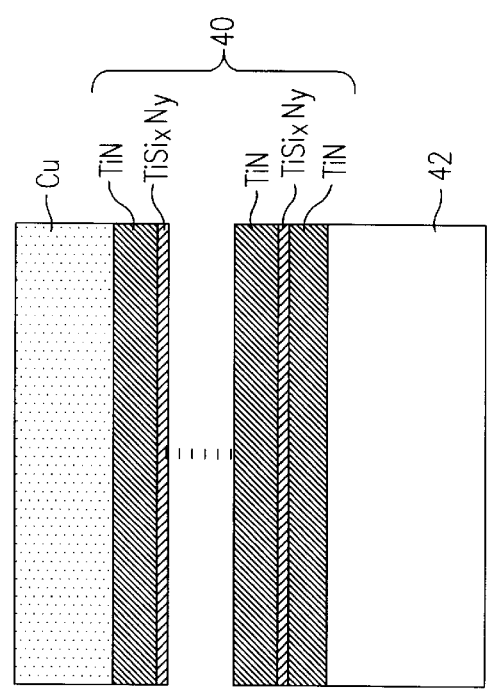
FIG. 6 is a schematic cross-sectional view of a multilayer diffusion barrier comprising a TiN/TiO$_x$N$_y$ stack, in accordance with a further embodiment of the invention.

FIG. 6 is a schematic cross-sectional view of a multilayer diffusion barrier, in accordance with a further embodiment of the invention. As shown in FIG. 6, TiN sublayers are alternated with titanium oxonitride ($TiO_xN_y$) sublayers. A stack 60 is shown as a diffusion barrier/wetting layer between aluminum (Al) and an underlayer 62, which can be Si, $SiO_2$ or metal (e.g., Cu, Al or W). The thicknesses of the TiN and $TiO_xN_y$ layers are in a range of from 30 angstroms to 50 angstroms and from 10 angstroms to 20 angstroms, respectively. The number of sublayers may range from 3 to 10, preferably 5.

In accordance with the present embodiment, the TiN sublayers provide for the adhesion of stack 60 to underlayer 62 and for low overall resistance of stack 60. The upper TiN sublayer serves as a nucleation and wetting layer for subsequent Al metallization.

In operation an electric current passes between Al overlayer and underlayer 62 through stack 60 in a direction substantially normal to the planes of sublayers TiN, $TiO_xN_y$. Because of the structure and the material properties of sublayers TiN, $TiO_xN_y$, stack 60 effectively blocks diffusion of atoms between Al overlayer and underlayer 62 but presents a low resistance to electric current between Al overlayer and underlayer 62.

Figure 7:
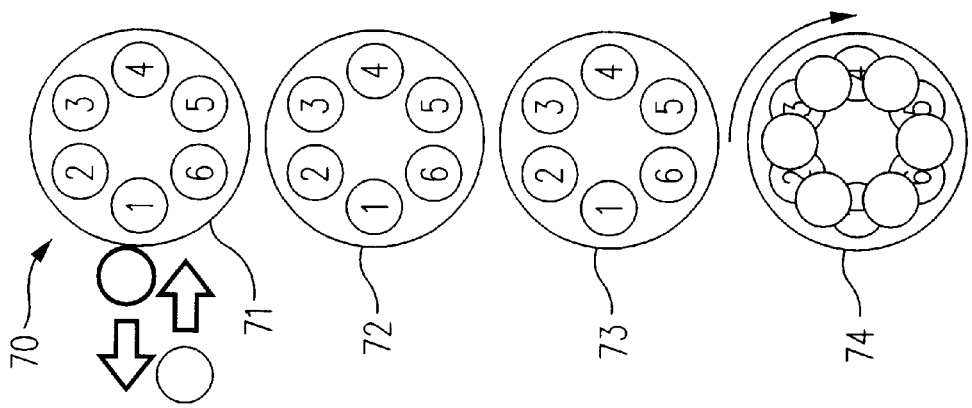
FIG. 7 is a schematic diagram of a deposition system for forming the TiN/TiO$_x$N$_y$ stack of FIG. 6.

FIG. 7 is a schematic diagram of a deposition system 70 for forming TiN/$TiO_xN_y$ stack 60. TiN/$TiO_xN_y$ stack 60 is deposited by a sequential process combining metallorganic chemical vapor deposition (MOCVD) of TiN and post deposition treatment of the film surface in $N_2/O_2$ mixture. The deposition is conducted using system 70 with six deposition stations, denoted by circled numerals 1,2, . . . ,6. Each station consists of a resistively heated pedestal and showerhead. In a first processing step 71, a processed wafer is unloaded from station 1 and a new wafer is loaded (denoted by arrows at processing step 71). The other stations are idle. In a second processing step 72, the wafer in station 1 is heated to the process temperature (typically 300° C.), while the other wafers are deposited with MOCVD TiN using tetrakis (diethylamido)titanium (TDEAT) and ammonia. In a third processing step 73 the wafers on stations 2–5 are soaked in a $N_2/O_2$ mixture while the wafers on station 1 and 6 are idle. In a fourth processing step 74, all wafers are rotated to their respective next stations, and the entire processing sequence of steps 71–74 is repeated.

In accordance with the invention, the key diffusion barrier properties, such as overall electrical resistance, metallurgical stability, adhesion to the substrate, adhesion of subsequent films, overall mechanical stress, chemical stability, and chemical-mechanical polishing rates, can be advantageously engineered by selecting the compositions and thicknesses of the barrier sublayers in a multilayer diffusion barrier. Multilayer diffusion barrier stacks may be formed according to the embodiments between Cu or Al and a variety of underlayer materials, including semiconductor, oxide, and metal.

Multilayer diffusion barriers are differentiated from conventional barrier structures by the following characteristics:

Grain boundary diffusion is suppressed by the multilayer film structure. The extent of the grain boundaries is limited to the thickness of the sublayers. This effect results in superior diffusion barrier reliability in comparison with conventional diffusion barriers having polycrystalline columnar texture.

Sheet resistance is substantially reduced. Layering highly conductive material (sublayer A) with ultrathin barrier material (sublayer B) yields low resistance layers.

Adhesion to underlying substrate and subsequent metallization layers is enhanced. The adhesion properties of a multilayer stack can be advantageously engineered by selecting the composition of the initial and final sublayers. The first sublayer is chosen to provide strong adhesion to the substrate, while the last sublayer is chosen to provide strong adhesion to the subsequently deposited conductive metal. This strong adhesion provides superior mechanical interface integrity important for successful processing of the wafers by chemical mechanical polishing (CMP).

The wetability of the diffusion barrier surface for a subsequent metal fill can be optimized by selecting the composition and properties of the final sublayer. Good wetability is critical for reliable metal fill (by PVD or CVD) of small size/high aspect ratio interconnect lines and vias.

The multilayer films can be deposited easily by a CVD process in a conventional multistation module. Although the invention has been described in terms of a certain preferred embodiment, other embodiments apparent to those skilled in the art are also within the scope of this invention. Accordingly, the scope of the invention is intended to be defined only by the claims which follow.

What is claimed is:

1. A semiconductor device comprising:

an underlying device region;

an overlying interconnect region; and a multilayer diffusion barrier providing an electrically conductive path between said device region and said interconnect region, said multilayer diffusion barrier comprising at least two sublayers comprising a first sublayer consisting of a first material and a second sublayer adjacent said first sublayer consisting of a second material different from said first material, said multilayer diffusion barrier suppressing diffusion of atoms between said device region and said interconnect region, said at least two sublayers comprising at least two bilayers, each of said bilayers consisting of two of said sublayers having respectively chemically distinct compositions.

2. The device according to claim 1, wherein said interconnect region contains a material selected from the group consisting of aluminum and copper.

3. The device according to claim 1, wherein at least one of said sublayers consists of a material exhibiting electrical resistivity of the order of less than 50 microohm cm.

4. The device according to claim 1, wherein at least one of said sublayers consists of a material exhibiting adhesion to said interconnect region.

5. The device according to claim 1, wherein at least one of said sublayers consists of a material exhibiting adhesion to said device region.

6. The device according to claim 1, wherein at least one of said sublayers consists of a material exhibiting greater suppression of diffusion of atoms between the materials of said interconnect region and said device region, respectively, than does the material of a second one of said sublayers.

7. The device according to claim 1, wherein said first sublayer provides nucleation for forming said second sublayer.

8. The device according to claim 1, wherein said second material is not chemically reactive with said first material under conditions encountered during the fabrication of said device.

9. The device according to claim 1, wherein at least one of said sublayers contains a material that provides a wetting surface for a material of said interconnect region.

10. The device according to claim 1, wherein a first one of said sublayers and a second one of said sublayers generate compressive and tensile mechanical stresses respectively, thereby providing mechanical stress compensation in said multilayer diffusion barrier.

11. A semiconductor device comprising:

an underlying device region;

an overlying interconnect region; and a multilayer diffusion barrier providing an electrically conductive path between said device region and said interconnect region, said multilayer diffusion barrier comprising at least two sublayers comprising a first sublayer consisting of a first material and a second sublayer adjacent said first sublayer consisting of a second material different from said first material, said multilayer diffusion barrier suppressing diffusion of atoms between said device region and said interconnect region, wherein said first sublayer provides nucleation for forming said second sublayer.

12. The device according to claim 11, wherein said interconnect region contains a material selected from the group consisting of aluminum and copper.

13. The device according to claim 11, wherein one of said sublayers consists of a material exhibiting electrical resistivity of the order of less than 50 microohm cm.

14. The device according to claim 11, wherein at least one of said sublayers consists of a material exhibiting adhesion to said interconnect region.

15. The device according to claim 11, wherein at least one of said sublayers consists of a material exhibiting adhesion to said device region.

16. The device according to claim 11, wherein said first material exhibits suppression of diffusion of atoms between said interconnect region and said device region greater than does said second material.

17. The device according to claim 11, wherein said second material is not chemically reactive with said first material under conditions encountered during the fabrication of said device.

18. The device according to claim 11, wherein at least one of said sublayers contains a material that provides a wetting surface for a material of said interconnect region.

19. The device according to claim 11, wherein said first material and said second material generate compressive and tensile mechanical stresses respectively, thereby providing mechanical stress compensation in said multilayer diffusion barrier.

* * * * *